United States Patent [19]

Kochersperger

[11] Patent Number: 4,750,857

[45] Date of Patent: Jun. 14, 1988

[54] WAFER CASSETTE TRANSFER MECHANISM

[75] Inventor: Peter Kochersperger, Greenwich, Conn.

[73] Assignee: The Perkin-Elmer Corporation, Norwalk, Conn.

[21] Appl. No.: 859,586

[22] Filed: May 5, 1986

[51] Int. Cl.⁴ .............................................. B65G 65/00
[52] U.S. Cl. .................... 414/609; 414/417; 414/404
[58] Field of Search ............ 414/609, 222, 403, 404, 414/416, 417, 612, 615, 786

[56] References Cited

U.S. PATENT DOCUMENTS

| | | | |
|---|---|---|---|
| 3,782,563 | 1/1974 | Brockmeyer et al. | 414/609 X |
| 3,964,623 | 6/1976 | Verhein et al. | 414/417 |
| 4,203,696 | 5/1980 | Lindberg | 414/609 X |
| 4,536,122 | 8/1985 | Herrmann et al. | 414/404 |
| 4,573,851 | 3/1986 | Butler | 414/404 |
| 4,588,341 | 5/1986 | Motoda et al. | 414/417 X |
| 4,614,474 | 9/1986 | Sudo | 414/416 X |

FOREIGN PATENT DOCUMENTS 823143 4/1981 U.S.S.R. .............................. 414/609

Primary Examiner—Peter A. Aschenbrenner
Attorney, Agent, or Firm—Thomas P. Murphy; Edwin T. Grimes; Paul A. Fattibene

[57] ABSTRACT

A wafer cassette transfer mechanism is disclosed which transfers a wafer cassette from a transfer arm to an elevator. The elevator moves vertically, up or down, so as to move the wafer cassette to a second transfer arm. The second transfer arm can then move the wafer cassette to after processing equipment.

4 Claims, 1 Drawing Sheet

WAFER CASSETTE TRANSFER MECHANISM

FIELD OF THE INVENTION

The present invention relates to semiconductor processing equipment and, more specifically, to equipment for automatically moving wafer cassettes containing a plurality of semiconductor wafers.

BACKGROUND OF THE INVENTION

The semiconductor device manufacturing industry has changed dramatically since its inception some twenty-five years ago. The minimum feature size of circuits on chips and transistors per bit decreased as productivity increased. Such changes necessitated and drove the search for new more efficient manufacturing processes.

One dynamic area for change in manufacturing processes of semiconductor products has been in fabrication automation. The motivations for automation are clear, viz., product cost minimization, shortened production cycles and improved product quality. One of the prime factors affecting the foregoing is the interaction of people with the manufacturing processes. Generally stated, to the extent work can be physically isolated from the workers, the objectives of wafer fabrication automation can be met. The effects of human error and contamination are fast becoming intolerable in the wafer fabrication process.

One area of the wafer fabrication process in which automation can be applied is the movement of wafer cassettes. Wafer cassettes are holders for silicon wafers in which, usually, the wafers are arranged vertically on shelves. Hitherto, such wafer cassettes, or simply cassettes, had to be moved by a worker from one work station to another. Such movements are subject to human clumsiness, whereby cassettes can be dropped or jostled, subjecting the wafers to damage. In addition, and perhaps more importantly, the mere presence of people in close proximity to a wafer fabrication line can drastically affect the cleanliness of the operation, thus leading to the particulate contamination of the wafer surfaces. This situation cannot be corrected by any known air cleaning efforts.

Accordingly, the present invention provides a wafer cassette handling system wherein the movements of the cassette are accomplished automatically. This leads to greatly reduced particulate contamination levels and lessened opportunity for mechanical damage to the wafers contained in the cassette. Previous attempts at automating the process called for grabbing the cassette from the top which inherently leads to contamination.

BRIEF DESCRIPTION OF THE INVENTION

The many objects of the present invention are accomplished, briefly, by providing an automated wafer cassette handling system.

Such a system includes a transfer arm which moves the wafer cassette to an elevator. Once on the elevator the wafer cassette can be moved vertically up or down so as to remove or replace the wafer cassette on the transfer arm. The elevator moves the wafer cassette to a proper position for it to be loaded, by another transfer arm, and into wafer processing equipment.

There has thus been outlined rather broadly the more important features of the invention in order that the detailed description thereof that follows may be better understood, and in order that the present contribution to the art may be better appreciated. There are, of course, additional features of the invention that will be described hereinafter and which will form the subject of the claims appended hereto. Those skilled in the art will appreciate that the conception on which the disclosure is based may readily be utilized as a basis for designing other structures for carrying out the several purposes of the invention. It is important, therefore, that the claims be regarded as including such equivalent structures as do not depart from the spirit and scope of the invention.

Specific embodiments of the invention have been chosen for purposes of illustration and description, and are shown in the accompanying drawings, forming a part of the specification.

DETAILED DESCRIPTION OF THE INVENTION

Figure 1:
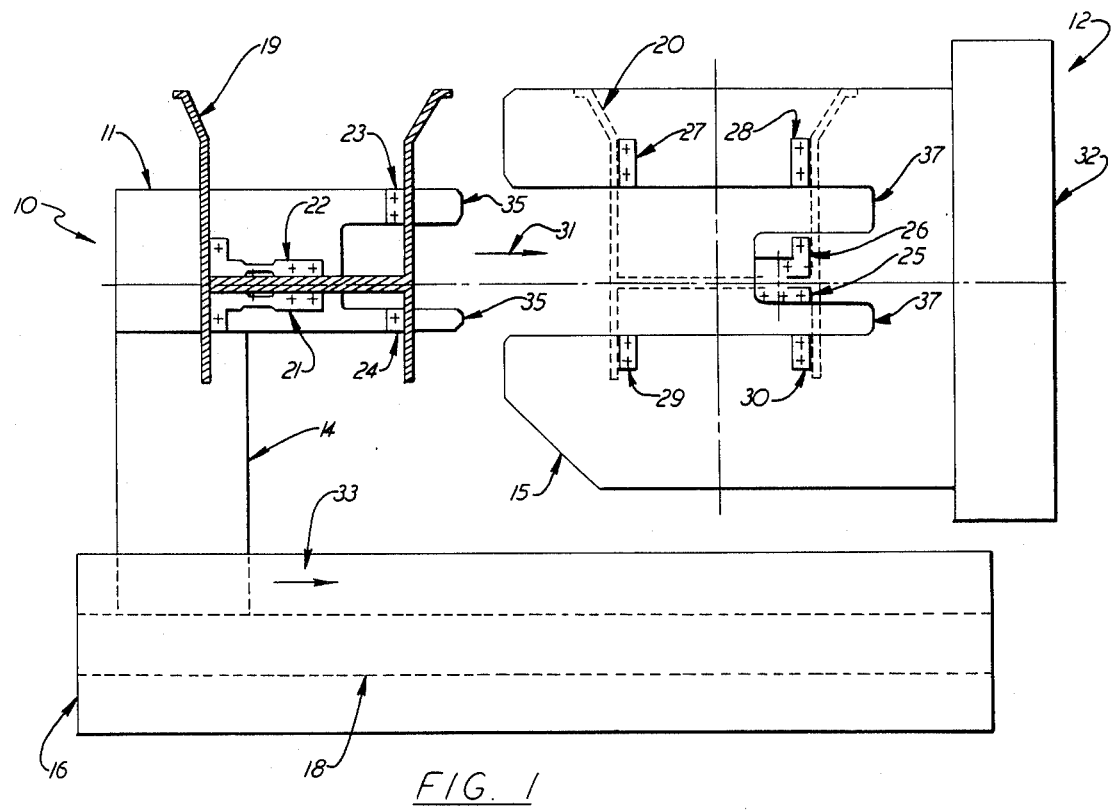
FIG. 1 shows a transfer arm and elevator in accordance with the present invention.

FIG. 1 shows a top view of a transfer arm 10 in working relation to a cassette elevator 12 in accordance with the present invention. The transfer arm 10 comprises a transfer platform 11 connected through an extension 14 to a transfer support 16. The extension 14 is connected to a transfer mechanism 18 which is, for example, a rodless cylinder. The purpose and operation of the transfer mechanism 18 is more fully explained hereinbelow.

A wafer cassette 19 is manually placed on the transfer platform 11. It is mechanically located with respect to the transfer platform 11 by mechanical stops 21-24. The wafer cassette 19 is shown in a sectional view so as to illustrate structural features of the underside of the cassette 19. The transfer platform 11 thus restrains the cassette 19 by restraining features found on the underside of the cassette 19.

The transfer mechanism 18 is energized so as to cause the extension 14, attached thereto, to move in a direction indicated by arrow 33. As the extension 14 moves, so too does the transfer platform 11. Thus, the transfer platform is moved in a direction shown by arrow 31 toward an elevator platform 15.

The elevator platform 15, at this point, is in the same plane as the transfer platform 11. Further, the elevator platform 15 is constructed so as to form a interdigitated relationship with the transfer platform 11 when the transfer platform 11 reaches the end of its travel. That is, when the forward surface 35 of the transfer platform 11 is proxmate to the rear surface 37 of the elevator platform 15.

Similar to the transfer platform 11 the elevator platform 15 has mechanical stops 25-30 disposed on its surface to accurately locate the cassette 20 on the surface thereof. It should be noted in this regard, that the transfer mechanism shown in FIG. 1 and described herein can be manually loaded initially with a wafer cassette 19 on transfer platform 11 and a wafer cassette 20 on elevator platform 15.

The elevator platform 15 is operably attached to an elevator mechanism 32 to raise and lower the elevator platform 15. The elevator mechanism 32 can be any convenient mechanism to accomplish the purposes of the present invention described herein.

Figure 2:
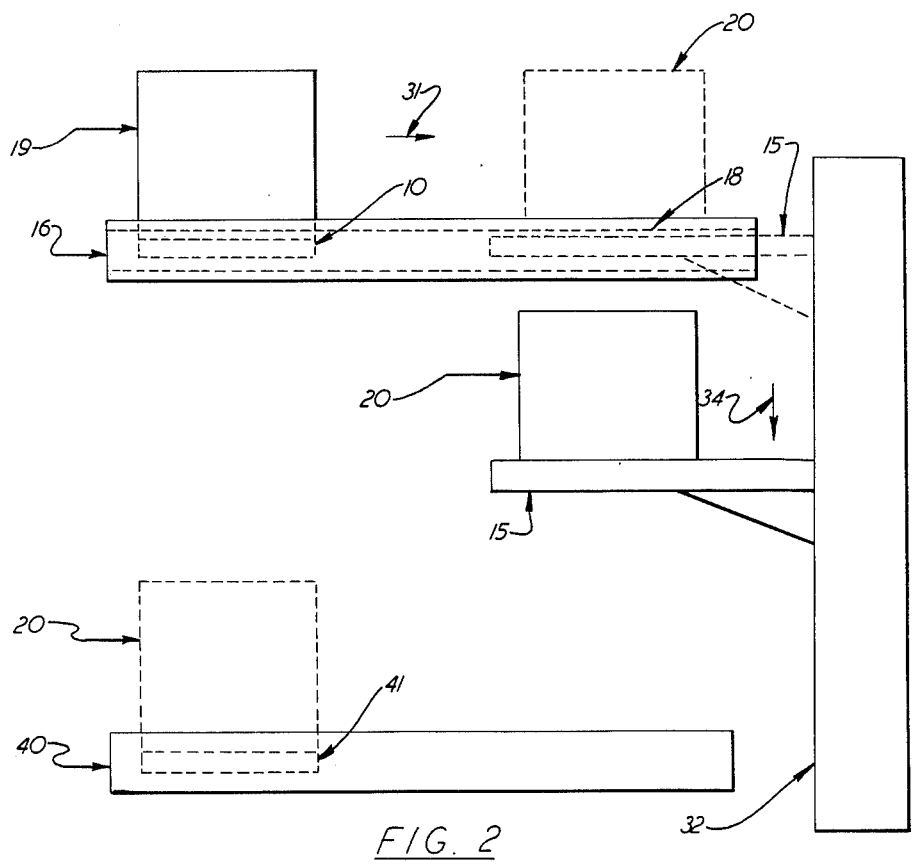
FIG. 2 shows schematically, an elevator and two transfer arms in accordance with the present invention.

Referring now to FIG. 2, the operation of the transfer arm 10 and elevator 12 is explained. While the present invention is described with particular reference to moving a cassette from one level down to another level, it should be understood that the apparatus hereindescribed has applicability in moving a cassette to any level up or down.

The elevator mechanism 32, initially, is at the same level as the transfer arm 10, as shown in dashed outline. At this point, two cassettes 19 and 20 are placed on the transfer arm 10 and elevator platform 15, respectively. The elevator mechanism 32 is then energized to move the elevator platform 15 downward, as shown, by an arrow 34. At the end of its downward travel, the elevator platform 15 is coplanar with a second transfer platform 41 used to move the cassette from the elevator platform 15 to wafer processing equipment, not shown. The transfer of the cassette 20 from the elevator platform 15 to transfer plateform 41 is similar to the transfer of cassette 19 to elevator platform 15 described hereinbelow. The transfer platform 41 and transfer support 40 are part of a transport mechanism identical to the transfer mechanism best seen in FIG. 1.

When the transfer of the cassette 20 from elevator platform 15 to transfer arm 41 is complete the elevator mechanism 32 is energized to move the elevator platform 15 in a direction opposite to that shown by the arrow 34. The elevator platform 15 is moved up to a position almost coplanar with the transfer platform 11 but below co-planarity by an amount substantially equal to the height of the mechanical stops 25-30. The transfer platform 11 is then moved, by the transfer mechanism 16 to a point where front surface 35 of the transfer platform, as shown in FIG. 1, is proximate to back surface 37 of the elevator platform 35. The elevator mechanism 32 is then energized so as to move the elevator platform 15 into a substantially coplanar relationship with the transfer platform 11. The mechanical stops 25-30 on the elevator platform, at this point, restrain the cassette 19. The elevator platform 15 is then moved upward by an amount equal to the height of mechanical stops 21-24 on the transfer platform 11 and the transfer platform 11 moves in a direction opposite to the arrow 31, thus completing the transfer of cassette 19 from the transfer arm 10 to the elevator 12.

Cassette 19 can then be automatically transferred to the processing equipment, not shown, in the manner described herein above in reference to FIG. 2 and cassette 20.

It can thus be seen that I have indeed provided a new and improved wafer cassette transfer mechanism that provides the art with an apparatus of increased speed, thruput and reduced contamination levels. Although specific embodiments have been illustrated and described, it will be obvious to those skilled in the art that various modifications may be made without departing from the spirit and scope of the invention which is to be limited solel

What is claimed is:

1. A wafer cassette transfer mechanism wherein a wafer cassette is automatically moved from a first level to processing equipment on a second level comprising:
    a first transfer platform;
    first stop means, attached to said first transfer platform, for holding a wafer cassette while the wafer cassette is in contact with said first transfer platform;
    a first transfer mechanism operably connected to said first transfer platform, to move said first transfer platform between first and second positions along a first line of travel;
    a second transfer platform;
    second stop means, attached to said second transfer platform, for holding the wafer cassette while the wafer cassette is in contact with said second transfer platform;
    a second transfer mechanism, operably connected to said second transfer platform, to move said second transfer platform between first and second positions along a second line of travel;
    said first and second transfer platforms being in vertical spaced relation to each other and substantially parallel to each other
    an elevator mechanism;
    an elevator platform, operably connected to said elevator mechanism;
    third stop means, attached to said elevator platform, for holding the wafer cassette while the wafer cassette is in contact with said elevator platform;
    said elevator mechanism adapted to move said elevator platform from a first elevator position to a second elevator position along a third line of travel substantially perpendicular to said first line of travel and said second line of travel;
    said first elevator position releasing the wafer cassette from contact with said first transfer platform when said first transfer platform is in said second position permitting the wafer cassette to be held by said elevator platform for transfer to said second elevator position;
    said second elevator position releasing the wafer cassette from contact with said elevator platform permitting the wafer cassette to be held by said second transfer platform when said second transfer platform is in said second position; and
    said first transfer platform, said second transfer platform and said elevator platform being formed so that said first transfer platform and said second transfer platform interdigitally engage said elevator platform when said first transfer platform and said elevator platform are in said second and first positions, respectively, or when said second transfer platform and said elevator platform are in said second positions, respectively.

2. A wafer cassette transfer mechanism as claimed in claim 1 wherein said first and second transfer platforms have mechanical stops fixedly disposed on the surfaces thereof adapted to removably hold said wafer cassette in fixed spatial relation thereto.

3. A wafer cassette transfer mechanism as claimed in claim 1 wherein said first and second transfer mechanisms are adapted to move said first and second transfer arms, respectively, relative to said elevator.

4. A method for transferring a wafer cassette from a first level to processing equipment at a second level comprising:
    providing a first transfer platform having a top surface adapted to removably hold a wafer cassette;
    providing a first transfer mechanism, operably connected to said first transfer platform, to move said first transfer platform along a first line of travel;
    providing a second transfer platform having a top surface adapted to removably hold a wafer cassette;

providing a second transfer mechanism, operably connected to said second transfer platform, to move said second transer platform along a second line of travel;

providing an elevator platform, adapted to removably hold a wafer cassette, and interdigitally engage said first and second transfer platforms operable to controllably move along a third line of travel intersecting said first line of travel and said second line of travel;

placing a wafer cassette on said first transfer platforms;

moving said elevator platform into almost coplanar relation with said first transfer platform;

energizing said first transfer mechanism to move said first transfer platform into interdigital relation to said elevator platform;

moving said elevator platform above the level of said transfer platform so as to lift the wafer cassette off said first transfer platform;

energizing said first transfer platform to move away from said elevator platform;

moving said elevator platform into almost the same plane as said second transfer platform;

energizing said second transfer mechanism to move said second transfer platform into interdigital relation with said elevator platform;

moving said elevator platform into coplanar relation with said second transfer platform;

moving said elevator platform below the plane of said second transfer platform so as to transfer the wafer cassette to said second transfer platform; and energizing said second transfer mechanism to move said second transfer platform away from said elevator platform.

* * * * *